United States Patent [19]

Bliehall

[11] Patent Number: 4,684,894
[45] Date of Patent: Aug. 4, 1987

[54] NMR SURFACE COIL POSITIONING DEVICE

[75] Inventor: James C. Bliehall, Pacifica, Calif.

[73] Assignee: Diasonics, Inc., San Francisco, Calif.

[21] Appl. No.: 861,869

[22] Filed: May 12, 1986

[51] Int. Cl.⁴ .............................................. G01R 33/20
[52] U.S. Cl. .................................... 324/318; 128/653; 324/300
[58] Field of Search ............... 324/300, 307, 309, 318, 324/207, 208, 219, 220, 262; 128/653; 336/121, 129

[56] References Cited

U.S. PATENT DOCUMENTS

| | | | |
|---|---|---|---|
| 2,158,103 | 5/1939 | Beyerle | 336/129 |
| 2,285,128 | 6/1942 | Rosenberg, Jr. | 336/121 |
| 3,113,280 | 12/1963 | Hobley | 336/129 |
| 4,441,078 | 4/1984 | Lecomte | 324/262 |
| 4,608,991 | 9/1986 | Rollwitz | 128/653 |

Primary Examiner—Stewart J. Levy
Assistant Examiner—Kevin D. O'Shea
Attorney, Agent, or Firm—Blakely, Sokoloff, Taylor & Zafman

[57] ABSTRACT

A positioning device for a surface coil used in NMR scanning is described. A non-metallic container allows a MRI surface oil to reside therein. An elongated rod extending through an opening on a side of the container is attached to the coil. A clear cover is placed over the container which is then placed under the patient. As the NMR scanning is performed for medical diagnosis, the coil is adjusted to the desired position by movement of the rod.

11 Claims, 7 Drawing Figures

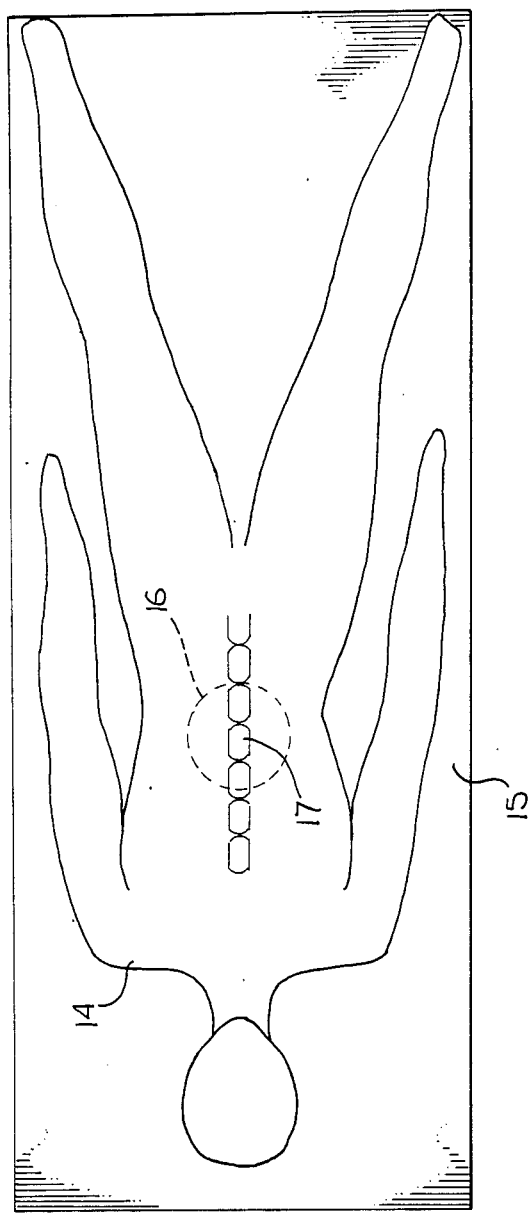
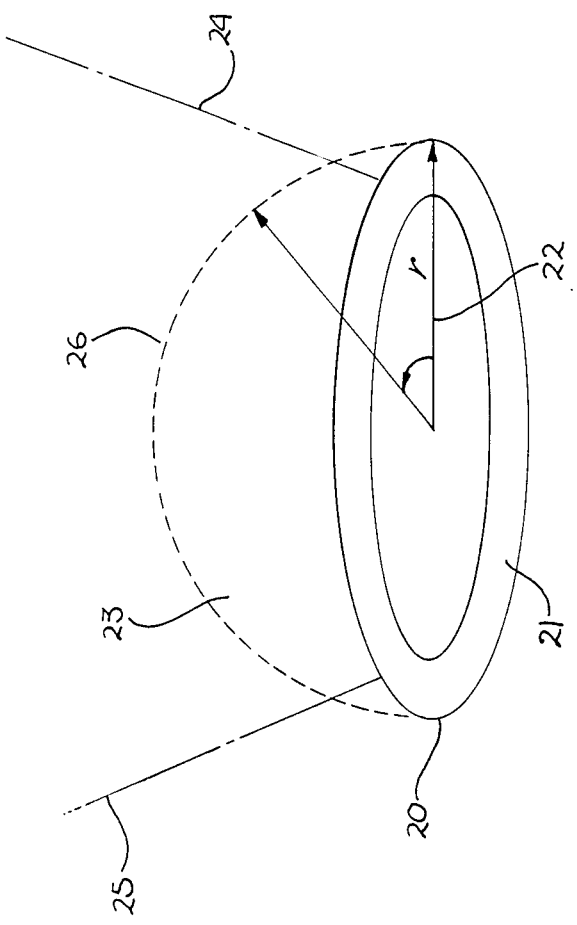
Fig. 2
(PRIOR ART)
Fig. 3
(PRIOR ART)

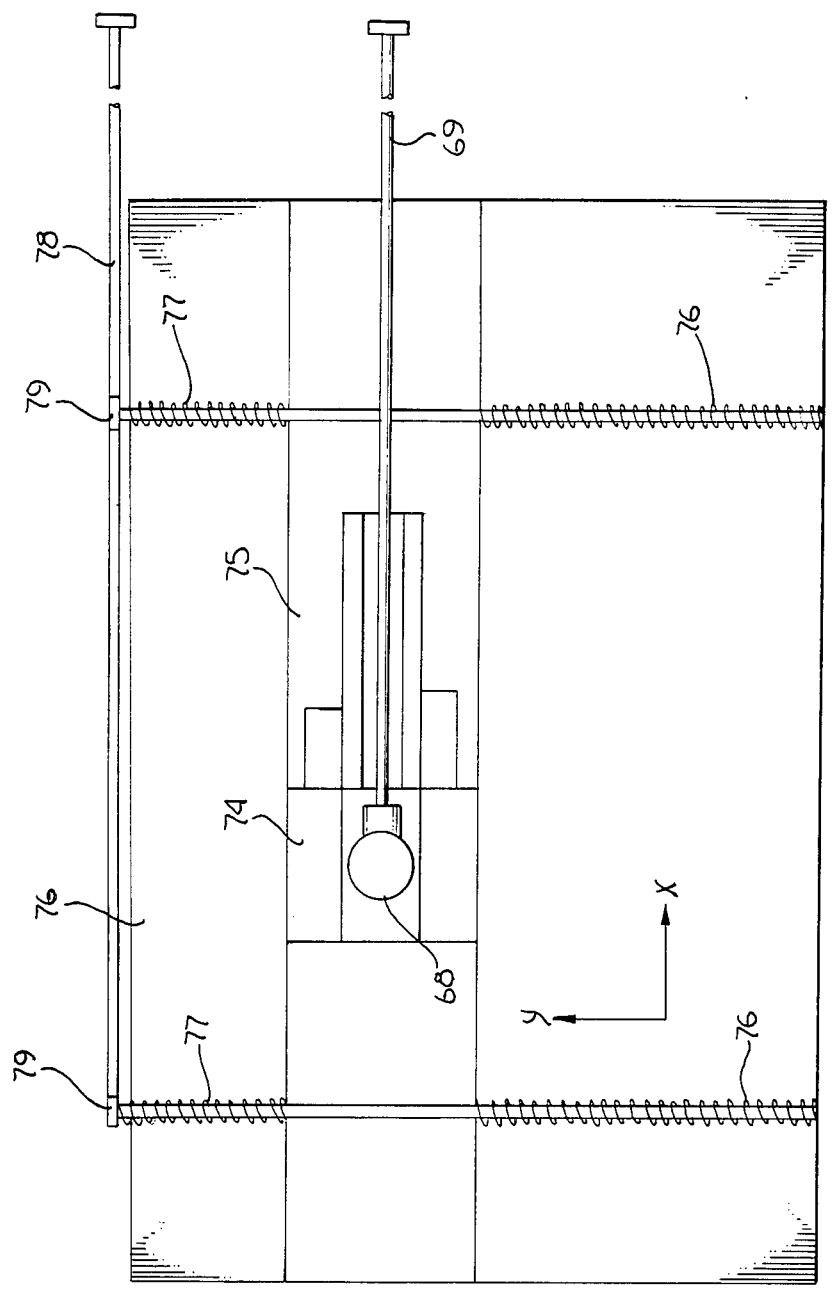

NMR SURFACE COIL POSITIONING DEVICE

BACKGROUND OF THE INVENTION

1. Field of the Invention

The apparatus of the present invention applies to a novel aspect of positioning a sensing coil and more specifically to adjusting a position of a nuclear magnetic resonance surface coil located under a patient's body.

2. Prior Art

Magnetic resonance imaging (MRI) technology, which is a specialized field of nuclear magnetic resonance (NMR), is well-known in the medical and instrumentation industry. Typically, a patient is placed on a flat surface and a surface coil is placed under a portion of the patient's body. The exact location of the placement of the surface coil is determined by the area of the body to be imaged. Then the patient and the table are placed into a bore of the NMR equipment.

However, if the core is initially placed improperly under the patient, this fact is not discovered until scanning occurs. Because the surface coil is kept physically small as possible to prevent reception of stray magnetic field signals, the precise placement of the surface coil under the patient is crucial. When improper placement occurs, the patient must be removed from the bore, the surface coil readjusted and the patient is reinserted for NMR scanning. This process will be repeated until desired placement of the surface coil is obtained.

Therefore, an improved device is needed which requires a simpler and less time consuming method to adjust the position of the scanning coil without repeated removal of the patient from the NMR equipment.

SUMMARY OF THE INVENTION

A surface coil positioning device is disclosed. During a NMR process, a scanning coil is placed under a fixed object. The scanning coil is placed within a container such that two opposing sides of the container form a slot. The container has an opening at one end of the slot, wherein the scanning coil is inserted into the slot and moved slideably within the slot. An elongated rod extends into the slot and is coupled to the scanning coil so that the positioning of the coil can be adjusted once the device is placed under the fixed body.

BRIEF DESCRIPTION OF THE DRAWINGS

FIG. 2 is a pictorial view showing the placement of the coil of FIG. 1 under a patient for imaging a portion of the patient's anatomy.

FIG. 3 is an elevation view showing the effective scanning area of a prior art surface coil.

FIG. 7 is an elevation view of an alternative embodiment showing an additional holding mechanism which allows two dimensional planar adjustment of the positioning device of FIG. 4.

DETAILED DESCRIPTION OF THE PREFERRED EMBODIMENT

An invention is described which provides for an adjustment of a scanning coil during a MRI scan without removing the object, such as a patient, from a bore of an MRI equipment during a scan. In the following description, numerous specific details are set forth, such as the use of a circular scanning coil, in order to provide a thorough understanding of the present invention. It will be obvious, however, to one skilled in the art that the present invention may be practiced without these specific details. In other instances, well-known techniques or devices have not been described in detail in order not to unnecessarily obscure the present invention.

PRIOR ART

Figure 1:
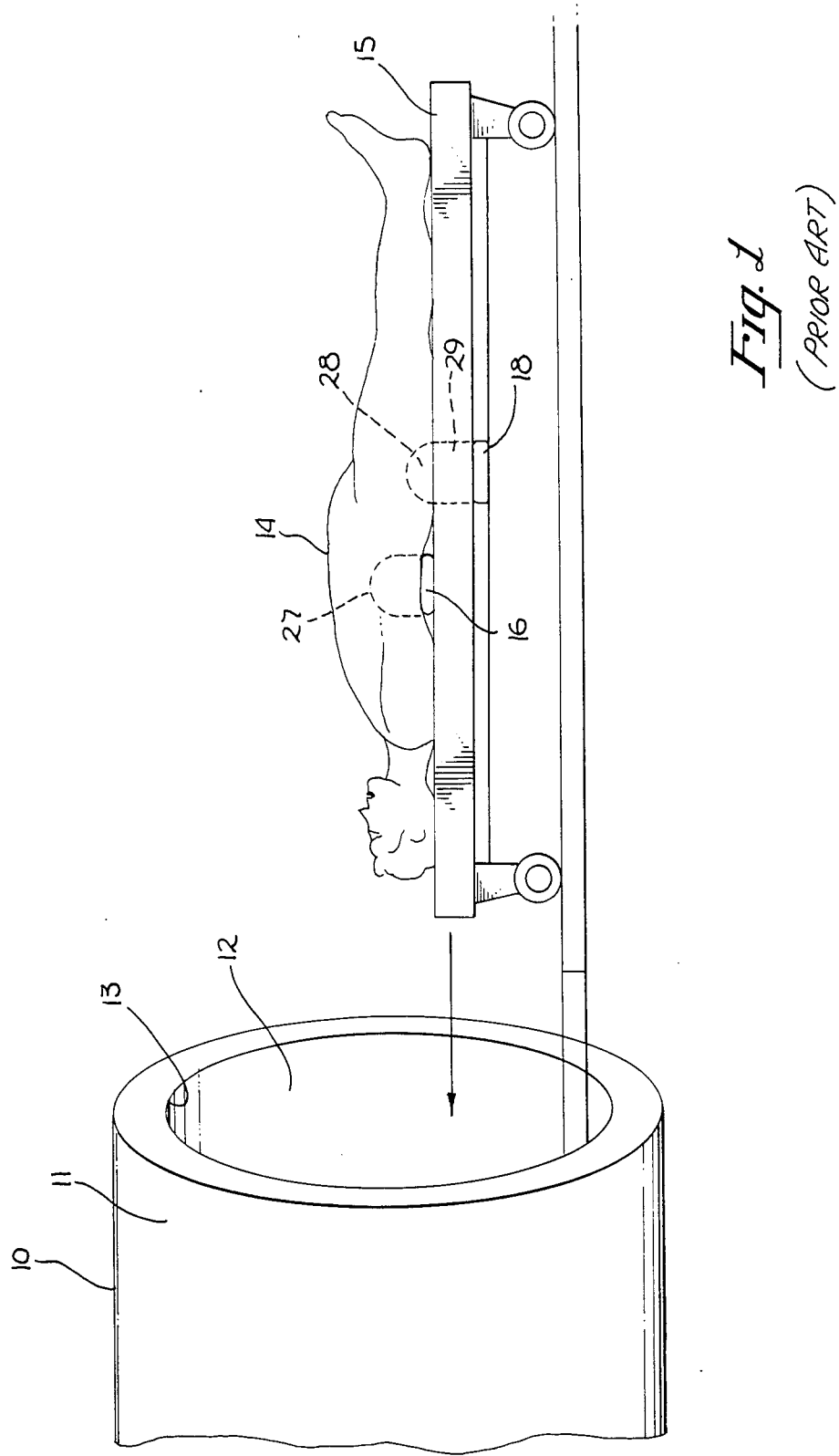
FIG. 1 is a pictorial view showing a prior art method of placing a surface coil under a patient for diagnostic NMR scans.

FIG. 1 shows a typical NMR apparatus 10 as used in imaging internal parts of a patient's body and providing medical diagnosis. The apparatus 10 is comprised of a large housing 11 with a hollow cylindrically shaped bore 12. Within the inside wall 13 of the housing 11 are located driving coils (not shown) for the generation of magnetic fields which provide the drive for the NMR.

A patient 14 is placed on a flat surface, such as on a table top 15. A surface coil 16, which is a small circular coil usually having a diameter of less than 10 inches, is placed in a flat position under the patient 14. The exact location of the placement of the coil 16 is determined by the area of the body to be imaged.

FIG. 2 shows a top view of FIG. 1 showing the patient 14 on a table top 15 and having the coil 16 positioned to view a section of the vertabrae 17. Referring again to FIG. 1, the patient 14 is then placed within the core 12 and NMR scanning is then performed.

FIG. 3 shows a typical prior art surface coil 20 formed into a circular ring 21 and typically having a radius 22 of less than 5 inches. The coil 20 is in reality a magnetic field receptor of the resonating frequencies generated by the molecules in the body during a MRI scan. The coil 20 is capable of scanning an area 23 determined by the circumference of the ring 21. The outer scanning limits are shown by lines 24 and 25. Further, an effective height of the scan is limited by the radius 22 of the ring 21. Therefore, the effective imaging area 23 is confined within dotted lines 26.

Although a larger coil would be preferable in order to increase the scanning area 23, a larger coil will necessarily cause reception of stray electromagnetic signals resulting in a lower signal to noise ratio for the image. Hence, a conflict exists in determining an optimum size of the surface coil 20 for the above reasons.

Referring again to FIG. 1, coil 16 is shown located on the table top 15 directly under the patient. The effective scanning area 27 extends well into the body in this instance. However, if the coil 16 is initially positioned incorrectly, the incorrect positioning will not be discovered until a cursory image is first obtained. The process involves placement of the coil under an immobilized patient 14, inserting the patient 14 into the bore 12, obtaining a cursory scan, digitizing and processing the scanned data, imaging and determining the degree of incorrect placement. When coil 16 has been determined to be improperly positioned, the patient 14 is removed from the bore 12 and the above sequence is repeated to determine the placement of the coil 16. The inability of determining the initial correct placement of the coil 16 may result in repeated time consuming adjustment steps.

One prior art method has provided for a relocation of the surface coil to a position below the table top 15. Coil 18 is positioned under the table top 15 so that it may be manually repositioned without moving patient 14. However, adjustment of coil 18 still requires the patient 14 to be withdrawn from the bore 12 for operators to adjust coil 18. Further, because of the placement, a portion 29 of the scan is lost due to the thickness of the table top 15 and the scanning area 28 extending into the body is much less in comparison to area 27.

PRESENT INVENTION

Figure 4:
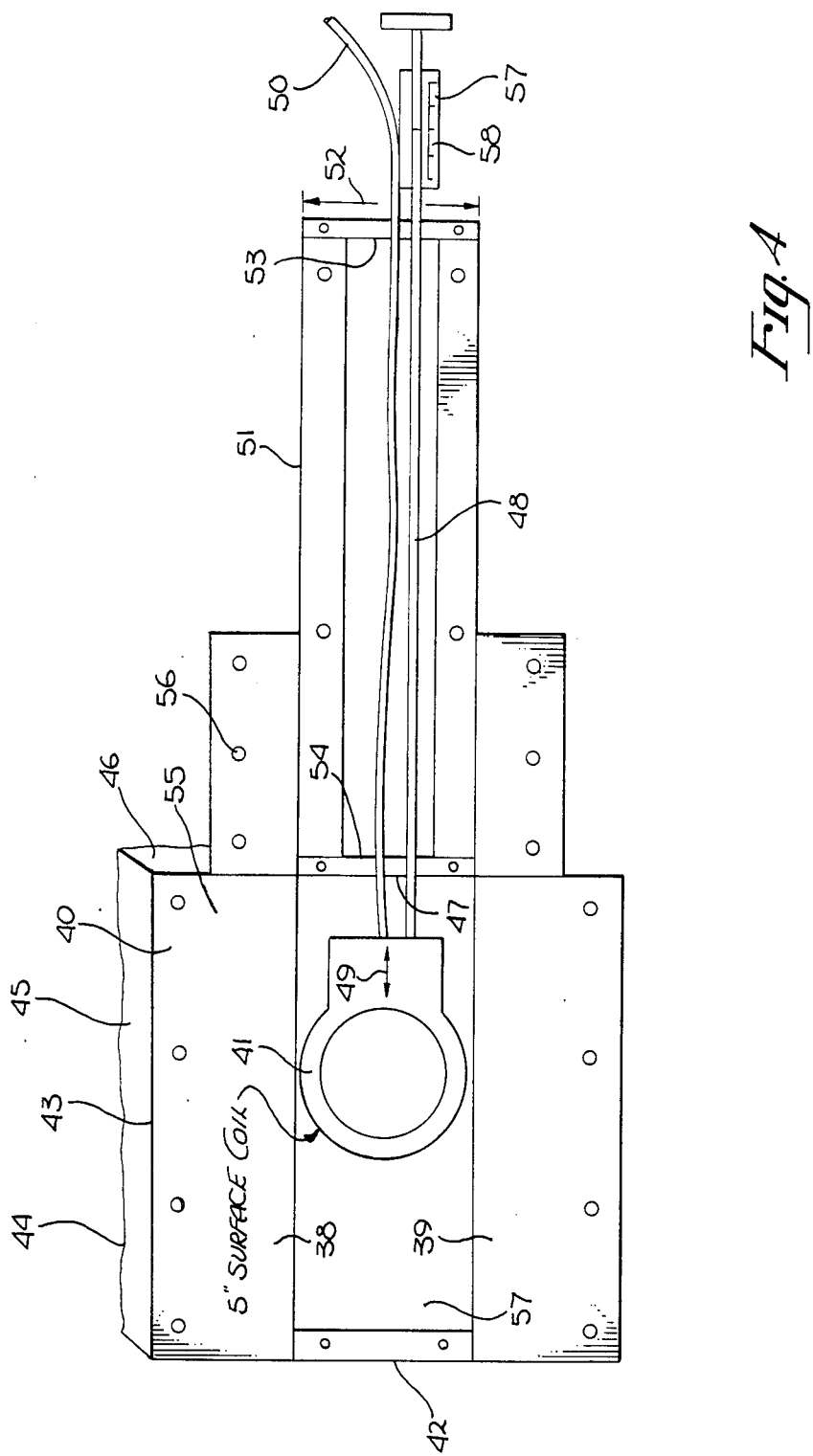
FIG. 4 is an elevation view of the positioning device of the present invention.

Referring to FIG. 4, a device 40 for positioning surface coil 41 is shown. Coil 41 may be any of the prior art coils used for MRI scanning. The device 40 of the preferred embodiment comprises a container 42 having a main coil housing 43 which is rectangular in shape. Housing 43 is formed by a bottom panel 44 and four side panels 45. Coil 41 is placed in a planar position within housing 43.

A side 46 of housing 43 has an opening 47 wherein an elongated adjustment rod 48 passes through the opening 47. The rod 48 is attached to the coil 41 and the movement of the rod 48 permits the coil 41 to move in the same direction as the rod 48 as shown by arrows 49. A flexible signal cable 50 also attached to the coil 41 passes through opening 47 and moves with the coil 41. Signal cable 50 carries signals from coil 41 to processing equipment (not shown).

The rod 48 and cable 50 are protected by another housing 51 which is attached to side 46. The width 52 of housing 51 may be larger than the diameter of the coil 41, such that coil 41 attached to rod 48 may be inserted at one end 53 of housing 51, traverse the length of housing 51, pass through opening 47 at the opposite end 54 of housing 51 and inserted into housing 43. The container 42 is made from a non-metallic material, such as plastic.

A cover 55 placed over both housings 43 and 51 of container 42 is mounted in place by non-metallic screws 56. The cover 55 may be made from the same material as the container 42, but a section 57 above the movement area of coil 41 must be transparent to permit no interference with the scanning. The preferred embodiment uses a clear Lexan TM brand material for the cover 55, although only section 57 need be transparent. Although the coil 41 may be placed on the bottom of the container 42 without restriction, the preferred embodiment has two opposing members 38 and 39 which form retaining walls to restrict the travel of the coil 41 to the slot formed between the members 38 and 39.

Figure 5:
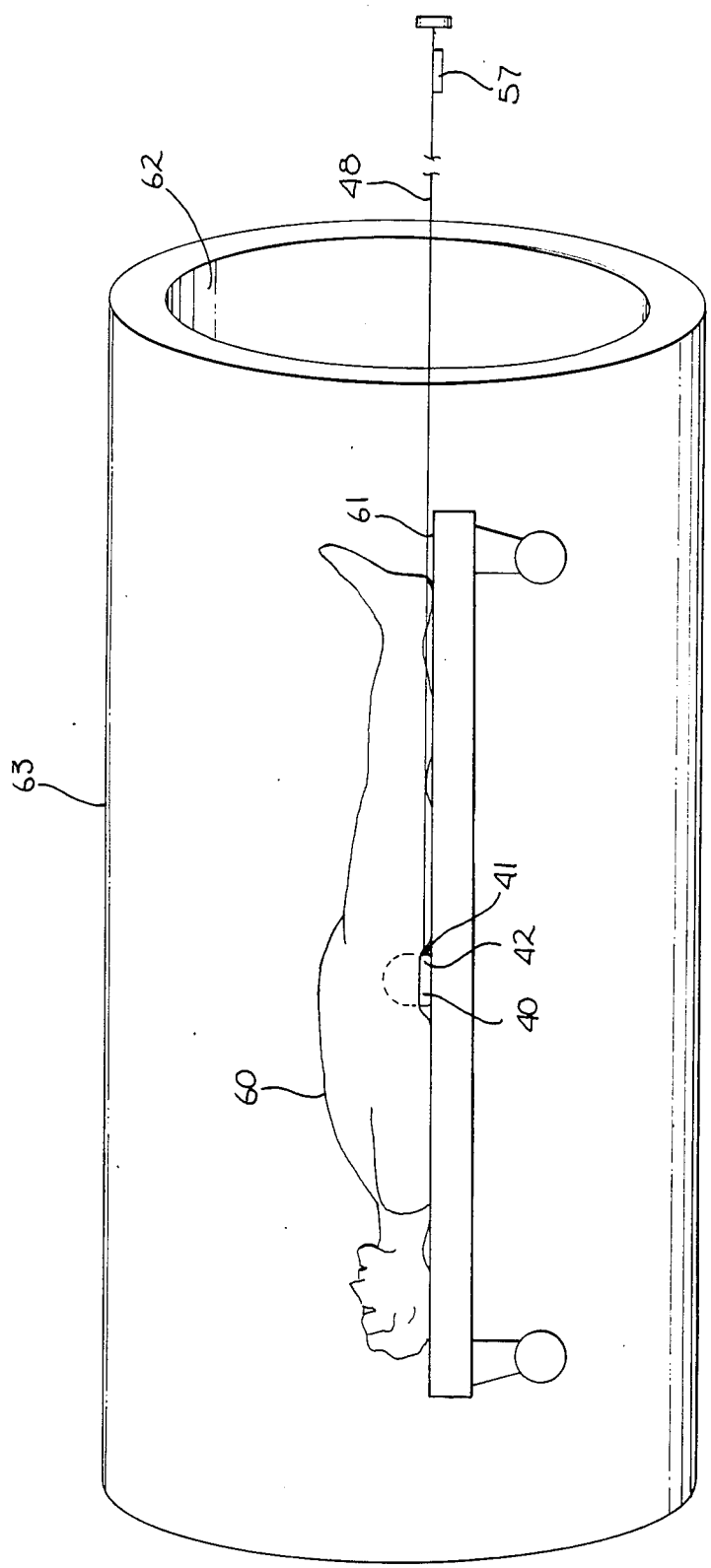
FIG. 5 is a pictorial view showing the placement of the positioning device of FIG. 4 and the patient within the bore of a NMR scanning equipment.

FIG. 5 shows the device 40 in operation. Container 42 having the surface coil 41 is placed on table 61 under patient 60. Device 40 is placed in an approximate position under patient 60. Then the table 61 is placed into the bore 62 of NMR equipment 63. Rod 48 extends outside of bore 62. Now as MRI scanning procedure is conducted, any necessary adjustment may be performed by moving rod 48, precluding any need for removing the patient 60 from the board to properly align the coil 41.

Figure 6:
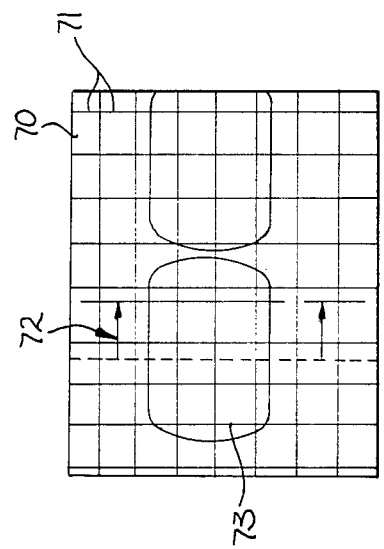
FIG. 6 is an elevation view of an image on a viewing screen during an MRI scan.

Referring to FIG. 6, a video display of the image scan is shown on display monitor screen 70. The screen 70 also includes a grid pattern 71 which accurately measures the amount of offset 72 of the positioning of the surface coil to centrally view the item to be viewed, such as a vertabrae 73. The locator scale 57 of FIGS. 4 and 5 having graduation markings 58 is adjusted the exact measurement necessary to center the image on screen 70.

An alternative embodiment of the present invention uses a more refined adjusting mechanism employing a micrometer calibration knob and a digital read-out display for displaying the measurements.

Referring to FIG. 7, a variation on the use of the present invention is shown. A device 74, equivalent to the device 40 of FIG. 4 is shown fitted within a track 75 of holding mechanism 76. The track 75 is a movable track and is mounted on screws 76. Spring 77 around screws 76 keeps tension on track 75. Screws 76 are coupled to rod 78 by gears 79, such that when rod 78 is turned, screws 76 also turn forcing track 75 to travel along the y-axis. The device of the present invention 74 is initially adjusted along track 75 and crudely positioned under a patient. Once the scanning sequence commences as described in the earlier paragraphs above, the coil 68 may be adjusted in the x-axis direction by rod 69 and y-axis direction by rod 78. Therefore, two-dimensional planar adjustment is possible once device 74 is placed under the patient and the patient placed within the bore of the earlier discussed equipment.

Thus, a surface coil positioning apparatus is described.

I claim:

1. An apparatus for positioning a scanning coil located underneath a fixed object comprising:
a container having two oppositely disposed members therein such that an elongated slot is formed between said members to accept said coil;
an elongated rod extending into said slot and coupled to said coil to slideably move said coil within said slot;
whereby a positioning adjustment of said coil is achieved without moving said fixed object.

2. The apparatus as defined in claim 1, wherein said container including a clear cover over said slot.

3. The apparatus as defined in claim 2, wherein said slot is rectangular to accept a circular coil.

4. The apparatus as defined in claim 3, wherein said container having an extended section to provide an enclosure of a portion of said rod.

5. The apparatus as defined in claim 4, wherein said rod is coupled to a measuring device to measure said positioning adjustment.

6. The apparatus as defined in claim 5, wherein said device is used for magnetic resonance imaging.

7. An apparatus for positioning a magnetic resonance imaging (MRI) sensing coil located underneath a human body comprising:
a rectangular container having a bottom, four sides and a top, and said container including two oppositely disposed members located therein, such that an elongated slot is formed between said members to accept said coil;
said container having an opening at one end of said slot for insertion of said coil in said slot;
an elongated rod extending through said opening into said slot and coupled to said coil to slideably move said coil within said slot;
whereby a positioning adjustment of said coil is achieved without moving said body.

8. The apparatus as defined in claim 7, wherein said container top including a clear over said slot.

9. The apparatus as defined in claim 8, wherein said container having an extended section to provide an enclosure of a portion of said rod.

10. The apparatus as defined in claim 9, wherein said rod is coupled to a measuring device to measure said positioning adjustment.

11. The apparatus as defined in claim 7, wherein said apparatus is mounted in a spring loaded track to provide for a second adjustment of said apparatus such that said second adjustment is perpendicular in direction to said positioning adjustment of said coil.

* * * * *